United States Patent
Otsuki et al.

(10) Patent No.: US 9,401,314 B2
(45) Date of Patent: Jul. 26, 2016

(54) METHOD OF TESTING SEMICONDUCTOR DEVICE

(71) Applicant: Mitsubishi Electric Corporation, Tokyo (JP)

(72) Inventors: Eiko Otsuki, Tokyo (JP); Yasuhiro Yoshiura, Tokyo (JP); Koji Sadamatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/242,016

(22) Filed: Apr. 1, 2014

(65) Prior Publication Data
US 2014/0363906 A1    Dec. 11, 2014

(30) Foreign Application Priority Data
Jun. 7, 2013   (JP) ................................ 2013-121043

(51) Int. Cl.
*H01L 31/024* (2014.01)
*G01R 31/28* (2006.01)
(Continued)

(52) U.S. Cl.
CPC .............. *H01L 22/14* (2013.01); *G01R 31/129* (2013.01); *H01L 29/063* (2013.01); *H01L 29/0619* (2013.01); *H01L 29/739* (2013.01); *H01L 29/861* (2013.01)

(58) Field of Classification Search
CPC ... H01L 23/295; H01L 23/36; H01L 23/3677; H01L 23/4824; H01L 24/11; H01L 24/16; H01L 24/81; H01L 23/3192
USPC .............. 257/E21.414, 48, 360; 438/99, 157, 438/778; 324/671, 752.02, 750.03, 456
See application file for complete search history.

(56) References Cited

U.S. PATENT DOCUMENTS 5,031,021 A  *  7/1991  Baba ....................... H01L 29/04
                                                           257/490
6,492,689 B2    12/2002  Yamauchi et al.
(Continued)

FOREIGN PATENT DOCUMENTS

JP    H08-255919 A    10/1996
JP    2001-007275 A    1/2001
(Continued)

OTHER PUBLICATIONS

An Office Action; "Notice of Reasons for Rejection," issued by the Japanese Patent Office on Oct. 6, 2015, which corresponds to Japanese Patent Application No. 2013-121043 and is related to U.S. Appl. No. 14/242,016; with English language partial translation.
(Continued)

*Primary Examiner* — Kimberly Rizkallah
*Assistant Examiner* — Brian Turner
(74) *Attorney, Agent, or Firm* — Studebaker & Brackett PC

(57) ABSTRACT

A method of testing a semiconductor device having a substrate in and on which a cell structure and a termination structure are formed, the cell structure having a main current flowing therethrough, the termination structure surrounding the cell structure, the method includes a first test step of testing dielectric strength of the semiconductor device, a charge removal step of, after the first test step, removing charge from a top surface layer of the termination structure, the top surface layer being located on the substrate and formed of an insulating film or a semi-insulating film, and a second test step of, after the charge removal step, testing dielectric strength of the semiconductor device.

14 Claims, 6 Drawing Sheets

(51) Int. Cl.

| | | |
|---|---|---|
| *H01L 23/58* | (2006.01) | |
| *G01R 1/067* | (2006.01) | |
| *G01N 27/60* | (2006.01) | |
| *H01L 21/66* | (2006.01) | |
| *G01R 31/12* | (2006.01) | |
| *H01L 29/739* | (2006.01) | |
| *H01L 29/06* | (2006.01) | |
| *H01L 29/861* | (2006.01) | |

(56) References Cited

U.S. PATENT DOCUMENTS

| | | | |
|---|---|---|---|
| 2009/0278204 A1* | 11/2009 | Morino et al. | 257/356 |
| 2010/0118455 A1* | 5/2010 | Kusunoki | 361/56 |
| 2011/0298485 A1* | 12/2011 | Narazaki | 324/755.05 |
| 2012/0153962 A1* | 6/2012 | Finch et al. | 324/456 |
| 2012/0293191 A1* | 11/2012 | Chen et al. | 324/691 |
| 2012/0299164 A1* | 11/2012 | Nishimura | H01L 29/0619 257/656 |
| 2013/0069694 A1 | 3/2013 | Saito et al. | |
| 2014/0167799 A1* | 6/2014 | Wang et al. | 324/750.14 |

FOREIGN PATENT DOCUMENTS

| | | |
|---|---|---|
| JP | 2001-313367 A | 11/2001 |
| JP | 2004-148438 A | 5/2004 |
| JP | 2008-153358 A | 7/2008 |
| JP | 2009-288090 A | 12/2009 |
| JP | 2010-066250 A | 3/2010 |
| JP | 2011-129616 A | 6/2011 |
| JP | 2013-069749 A | 4/2013 |

OTHER PUBLICATIONS

An Office Action issued by the Korean Patent Office on Oct. 21, 2015, which corresponds to Korean Patent Application No. 10-2014-0066770 and is related to U.S. Appl. No. 14/242,016; with English language partial translation.

An Office Action issued by the Korean Patent Office on Apr. 8, 2016, which corresponds to Korean Patent Application No. 10-2014-0066770 and is related to U.S Appl. No. 14/242,016; with English language partial translation.

An Office Action; Notification of Reason for Rejection, issued by the Japanese Patent Office on Apr. 5, 2016, which corresponds to Japanese Patent Application No. 2013-121043 and is related to U.S. Appl. No. 14/242,016; with English language partial translation.

* cited by examiner

METHOD OF TESTING SEMICONDUCTOR DEVICE

BACKGROUND OF THE INVENTION

1. Field of the Invention

The present invention relates to a method of testing a semiconductor device used, e.g., for high current switching.

2. Background Art

Japanese Laid-Open Patent Publication No. 2001-313367 discloses a semiconductor device in which a plurality of field limiting rings (FLRs) are formed in a termination structure. The FLRs serve to enhance the breakdown voltage, or dielectric strength, of the semiconductor device. A field insulating film formed by local oxidation of silicon (LOCOS) covers the portion of the principal surface of the substrate where the FLRs are formed.

It has been found, however, that if the insulating film of the termination structure is charged by polarization, the semiconductor device will exhibit an increased leakage current and an unstable dielectric strength in the dielectric strength test. The same problem arises if the semi-insulating film (if any) of the termination structure is charged. Therefore, it is necessary to remove charge from the insulating film and/or semi-insulating film of the termination structure.

SUMMARY OF THE INVENTION

The present invention has been made to solve the above problems. It is, therefore, an object of the present invention to provide a method of testing a semiconductor device which includes a charge removal step for removing charge from the insulating film and/or semi-insulating film of the termination structure of the semiconductor device.

The features and advantages of the present invention may be summarized as follows.

According to one aspect of the present invention, a method of testing a semiconductor device having a substrate in and on which a cell structure and a termination structure are formed, the cell structure having a main current flowing therethrough, the termination structure surrounding the cell structure, the method includes a first test step of testing dielectric strength of the semiconductor device, a charge removal step of, after the first test step, removing charge from a top surface layer of the termination structure, the top surface layer being located on the substrate and formed of an insulating film or a semi-insulating film, and a second test step of, after the charge removal step, testing dielectric strength of the semiconductor device.

According to another aspect of the present invention, a method of testing a semiconductor device having a substrate in and on which a cell structure and a termination structure are formed, the cell structure having a main current flowing therethrough, the termination structure surrounding the cell structure and having on a top surface thereof a top surface layer formed of an insulating film or a semi-insulating film, the method includes a charge removal step of removing charge from the top surface layer, and a test step of, after the charge removal step, testing dielectric strength of the semiconductor device.

According to another aspect of the present invention, a method of testing a semiconductor device having a substrate in and on which a cell structure and a termination structure are formed, the cell structure having a main current flowing therethrough, the termination structure surrounding the cell structure and having on a top surface thereof a top surface layer which is formed of an insulating film or a semi-insulating film and which is covered with a sealing material, the method includes a sealing material removal step of removing the sealing material to expose the top surface layer, and a charge removal step of, after the sealing material removal step, removing charge from the top surface layer.

Other and further objects, features and advantages of the invention will appear more fully from the following description.

DETAILED DESCRIPTION OF THE PREFERRED EMBODIMENTS

Figure 1:
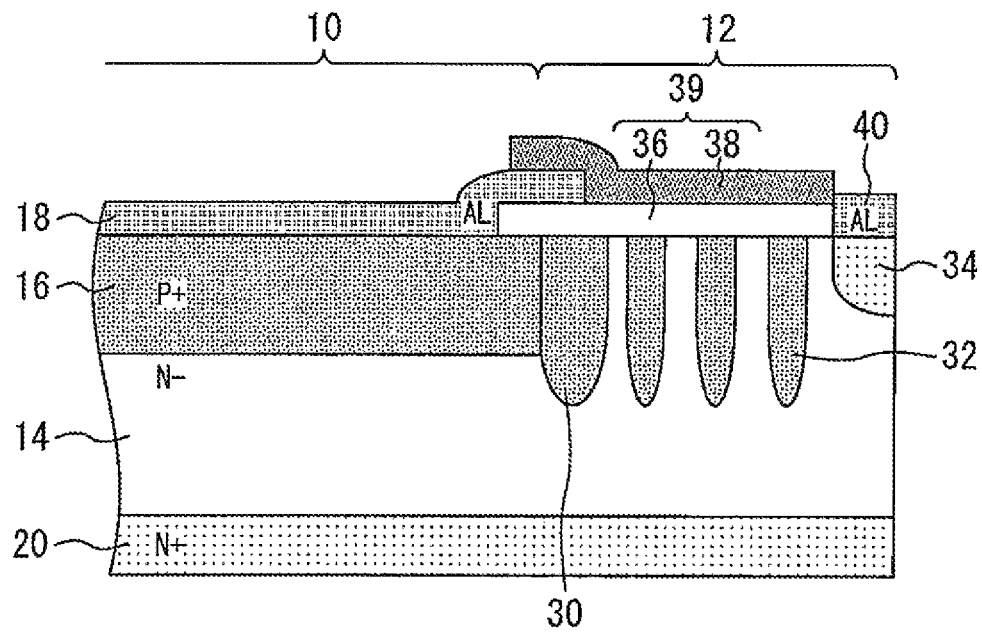
FIG. 1 is a cross-sectional view of a semiconductor device.

Methods of testing a semiconductor device in accordance with embodiments of the present invention will be described with reference to the accompanying drawings. Throughout the specification the same or corresponding components are designated by the same reference numerals and may be described only once.

First Embodiment

FIG. 1 is a cross-sectional view of a semiconductor device configured as a chip. This semiconductor device, or chip, has at its central portion a cell structure 10 through which the main current passes. A termination structure 12 is formed to surround the cell structure 10. Both the cell structure 10 and the termination structure 12 are formed in and on a substrate 14.

The cell structure 10 will be described. The cell structure 10 includes an anode 16 formed in the top surface side of the substrate 14. A top surface electrode 18 is formed on the anode 16. A cathode 20 is formed on the bottom surface of the substrate 14.

The termination structure 12 will be described. The termination structure 12 includes a well region 30, an FLR structure 32, and a channel stopper 34 which are formed in the top surface side of the substrate 14. The well region 30 is in contact with the anode 16. The FLR structure 32 has a plurality of field limiting rings (FLRs) formed therein. The FLR structure 32 forms a floating diffusion layer serving to reduce the electric field in the semiconductor device. The channel stopper 34 is formed in the top surface side of the substrate 14 on the side of the termination structure 12 opposite that adjacent the cell structure 10.

The termination structure 12 also includes an insulating film 36 which is formed on the substrate 14 and is in contact with the well region 30 and the FLR structure 32. The insulating film 36 is formed of $SiO_2$. A semi-insulating film 38 is formed on the insulating film 36. The insulating film 36 and the semi-insulating film 38 may be referred to collectively as the top surface layer 39. Thus, the top surface layer 39 is formed on and in contact with the plurality of FLRs. A peripheral electrode 40 is formed on the channel stopper 34 and is in contact with the top surface layer 39.

Figure 2:
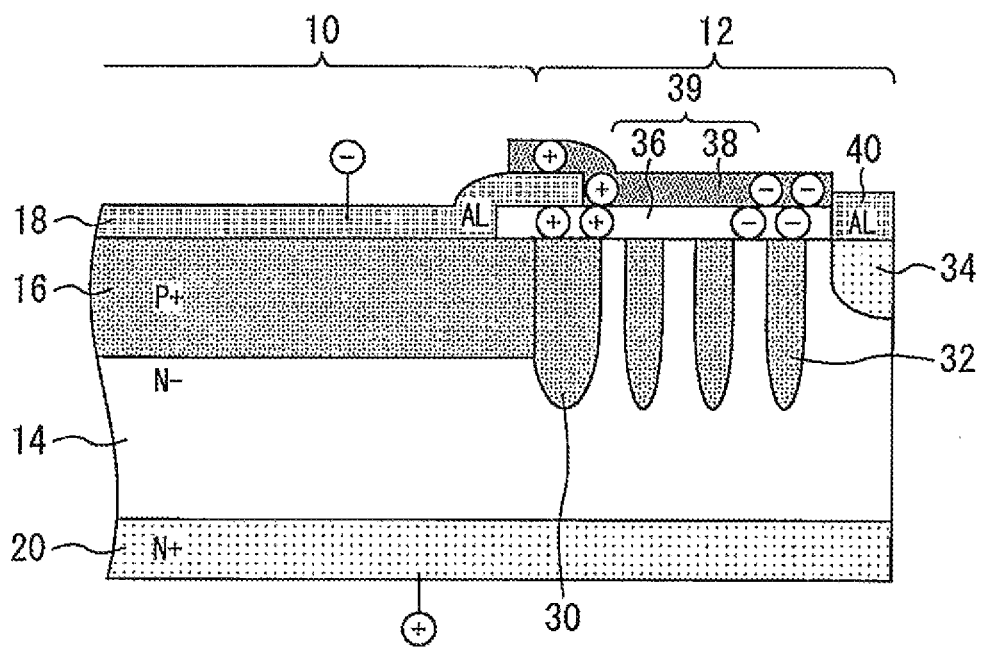
FIG. 2 is a cross-sectional view of the semiconductor device, illustrating the first test step.

A method of testing the above semiconductor device will be described. First, a first test step is performed to test the dielectric strength of the semiconductor device. FIG. 2 is a cross-sectional view of the semiconductor device, illustrating the first test step. In the first test step, a negative voltage is applied to the anode 16 while a positive voltage is applied to the cathode 20. That is, the anode 16 is at a lower potential than the cathode 20. As a result, the side of the top surface layer 39 in contact with the top surface electrode 18 is positively polarized, and the side of the top surface layer 39 in contact with the peripheral electrode 40 is negatively polarized.

Figure 3:
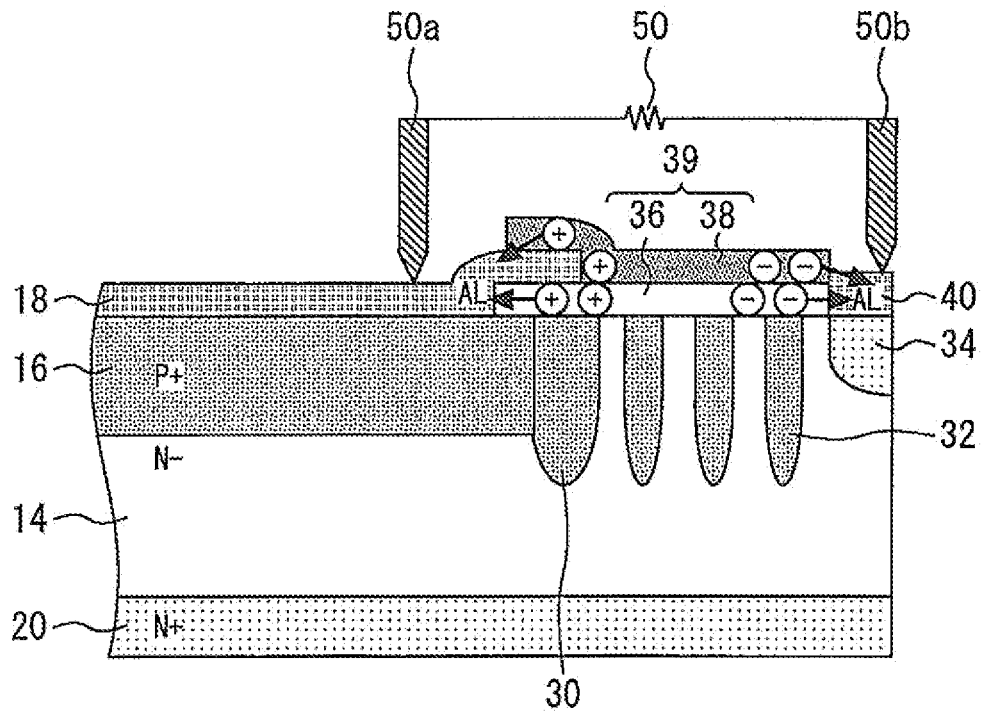
FIG. 3 is a cross-sectional view of the semiconductor device, illustrating the charge removal step.

After the first test step, a charge removal step is performed to remove charge from the top surface layer 39. FIG. 3 is a cross-sectional view of the semiconductor device, illustrating the charge removal step. The charge removal step uses a resistor device 50. A first conductor 50a is formed at one end of the resistor device 50, and a second conductor 50b is formed at the other end of the resistor device 50. The first conductor 50a and the second conductor 50b have, e.g., a needle-like shape.

In the charge removal step, the first conductor 50a is brought into contact with the top surface electrode 18 while the second conductor 50b is brought into contact with the peripheral electrode 40. Since the top surface electrode 18 is in contact with the side of the top surface layer 39 adjacent the cell structure 10 and the peripheral electrode 40 is in contact with the side of the top surface layer 39 adjacent the channel stopper 34, the resistor device 50 draws charge from both of these sides of the top surface layer 39. In FIG. 3, the arrows indicate the direction of movement of charge carriers. Thus, charge is removed from the top surface layer 39. After the charge removal step, a second test step is performed to test the dielectric strength of the semiconductor device.

Figure 4:
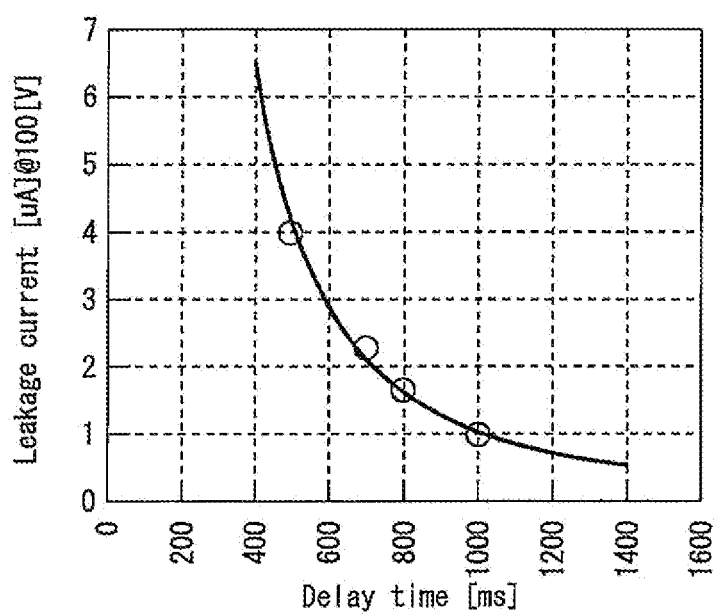
FIG. 4 is a graph illustrating the leakage current.

It should be noted that if the second test step is performed immediately after the first test step (without performing the charge removal step), charge flows from the charged top surface layer 39, i.e., a leakage current flows in the semiconductor device. In order to reduce this leakage current, the second test step may be performed a predetermined delay time after the first test step has been completed. FIG. 4 is a graph illustrating the leakage current detected in the second test step after a voltage of 3000 V is applied to the semiconductor device in the first test step, as a function of the delay time between the first and second test steps. As shown, in order to ensure that the leakage current detected in the second test step is 0.5 μA or less, the delay time must be at least approximately 1.4 seconds. This, however, results in increased inspection time.

In order to avoid this, the method of testing a semiconductor device in accordance with the first embodiment includes a charge removal step for removing charge from the top surface layer 39 after the first test step, thus eliminating the need for a delay time such as that described above. This results in decreased inspection time.

In the charge removal step, charge may be removed from the top surface layer 39 by different means than the resistor device 50. Further, the method of the present embodiment may be applied to any suitable semiconductor device having a termination structure. Examples of such semiconductor devices include IGBTs and MOSFETs in addition to diodes. Although in the present embodiment the top surface layer 39 is made up of the insulating film 36 and the semi-insulating film 38, it is to be understood that in other embodiments the top surface layer 39 may be made up of only one of these films. Although the method of the present embodiment has been described in connection with a semiconductor device configured as a chip, it is to be understood that the method may be applied to the semiconductor devices formed on a wafer. The termination structure 12 may include, instead of the FLR structure 32, a RESURF structure or a variation-of-lateral-doping (VLD) structure formed in the top surface side of the substrate 14. It should be noted that these alterations may also be made to the methods of testing a semiconductor device in accordance with the subsequently described embodiments.

Second Embodiment

Figure 5:
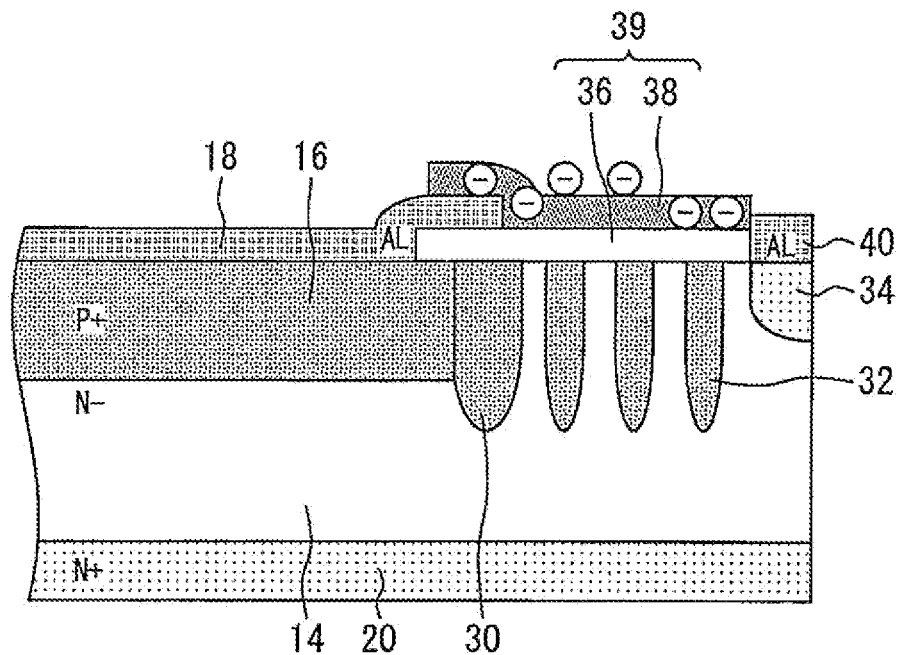
FIG. 5 is a cross-sectional view of a semiconductor device before it is tested.

FIG. 5 is a cross-sectional view of a semiconductor device before it is tested, this semiconductor device being similar to that described in connection with the first embodiment. As shown, charge is present on the top surface layer 39 due to external influences such as that caused by ions which have contaminated the semiconductor device during process steps. The method of testing a semiconductor device in accordance with a second embodiment of the present invention begins by removing such charge from the top surface layer 39 in a charge removal step.

Figure 6:
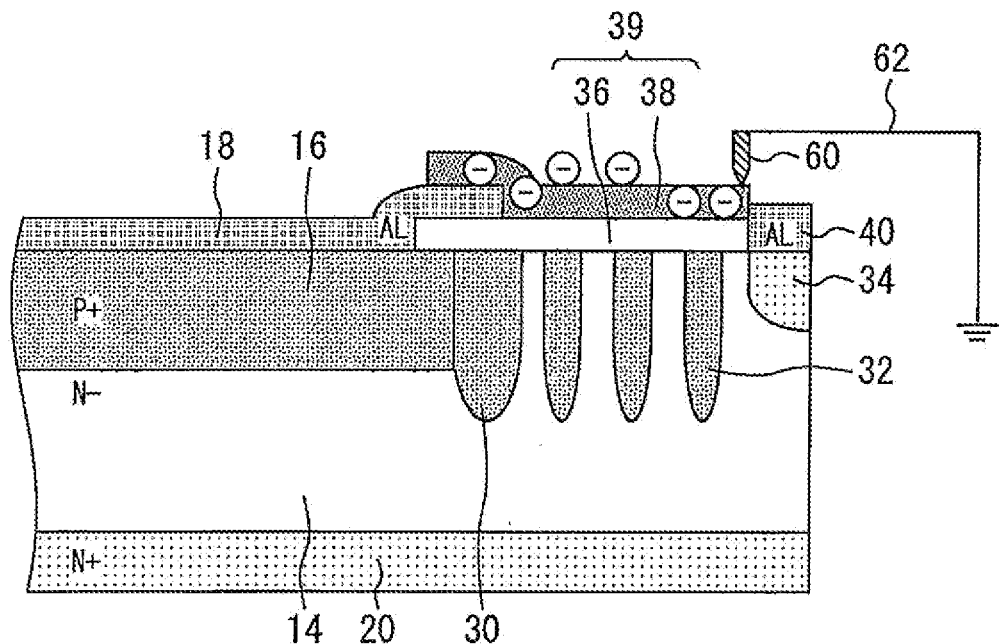
FIG. 6 is a cross-sectional view of the semiconductor device, illustrating the charge removal step of the second embodiment.

FIG. 6 is a cross-sectional view of the semiconductor device, illustrating the charge removal step of the second embodiment. This charge removal step uses a grounding device 62, one end of which has a conductor 60 and the other end of which is grounded. The conductor 60 has a needle-like shape. The conductor 60 is brought into contact with the top surface layer 39 so as to remove charge from the top surface layer 39. After the charge removal step, a test step is performed to test the dielectric strength of the semiconductor device. In this way the dielectric strength of the semiconductor device can be reliably measured.

It should be noted that when the top surface layer 39 has been charged due to external influence, the semiconductor device may be heated to remove charge from the top surface layer 39. This, however, may thermally damage the semiconductor device, and it takes time for the temperature of the heated semiconductor device to return to room temperature. In the test method of the second embodiment, on the other hand, charge is removed from the top surface layer 39 using the grounding device 62, meaning that there is no possibility of thermal damage to the semiconductor device and the inspection time can be reduced.

Figure 7:
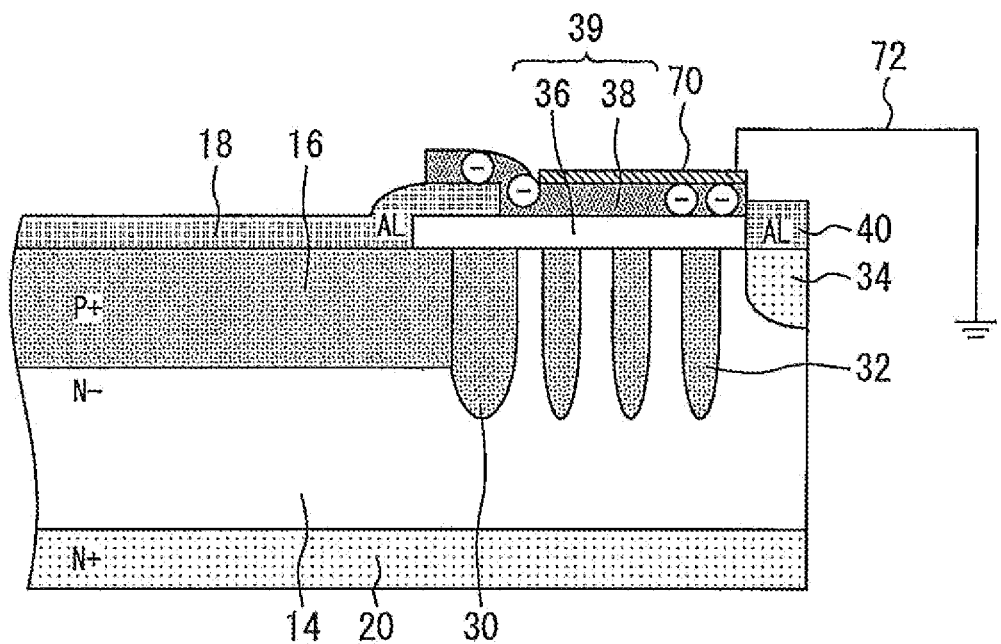
FIG. 7 is a cross-sectional view showing a variation of the grounding device.

FIG. 7 is a cross-sectional view showing a grounding device 72 which is a variation of the grounding device 62. The grounding device 72 has a strip-shaped conductor 70 formed at one end. The conductor 70 is a conductive plate. In the charge removal step, the conductor 70 is brought into surface contact with the top surface layer 39 so as to remove charge from the top surface layer 39. The grounding device 72 has a higher charge removal efficiency than the grounding device 62 shown in FIG. 6, since the conductor 70 is brought into surface contact with the top surface layer 39.

Figure 8:
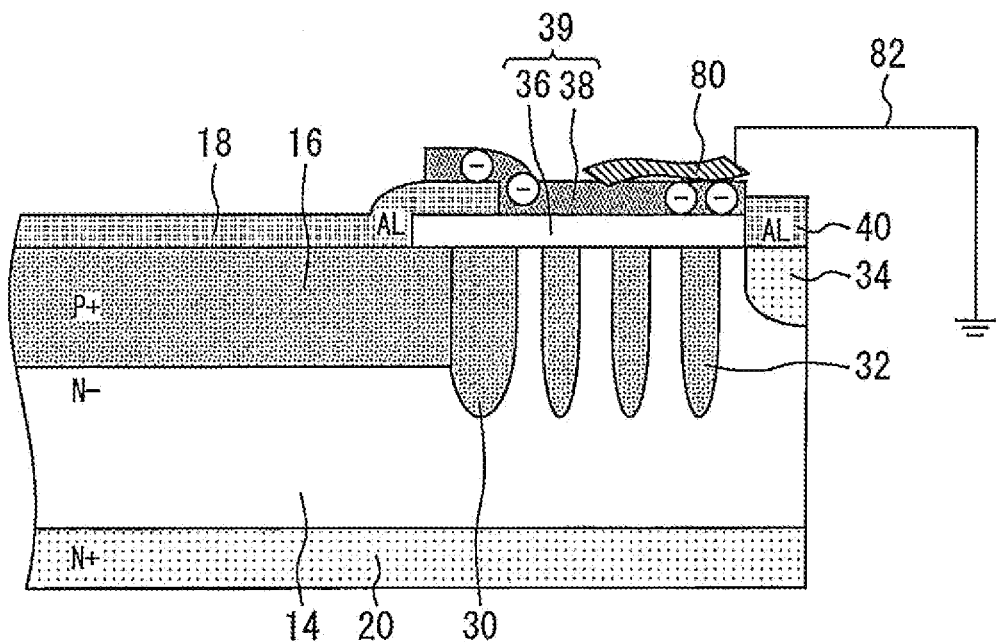
FIG. 8 is a cross-sectional view showing a another variation of the grounding device.

FIG. 8 is a cross-sectional view showing a grounding device 82 which is another variation of the grounding device 62. The grounding device 82 has a conductor 80 formed at one end. The conductor 80 is a conductive ribbon formed from, e.g., a metal foil. In the charge removal step, the conductor 80 is brought into surface contact with the top surface layer 39 so as to remove charge from the top surface layer 39. The grounding device 82 has a higher charge removal efficiency than the grounding device 62 shown in FIG. 6, since the conductor 80 is brought into surface contact with the top surface layer 39. Furthermore, the use of the grounding device 82 reduces damage to the top surface layer 39 as compared to the grounding device 72 shown in FIG. 7.

Third Embodiment

Figure 9:
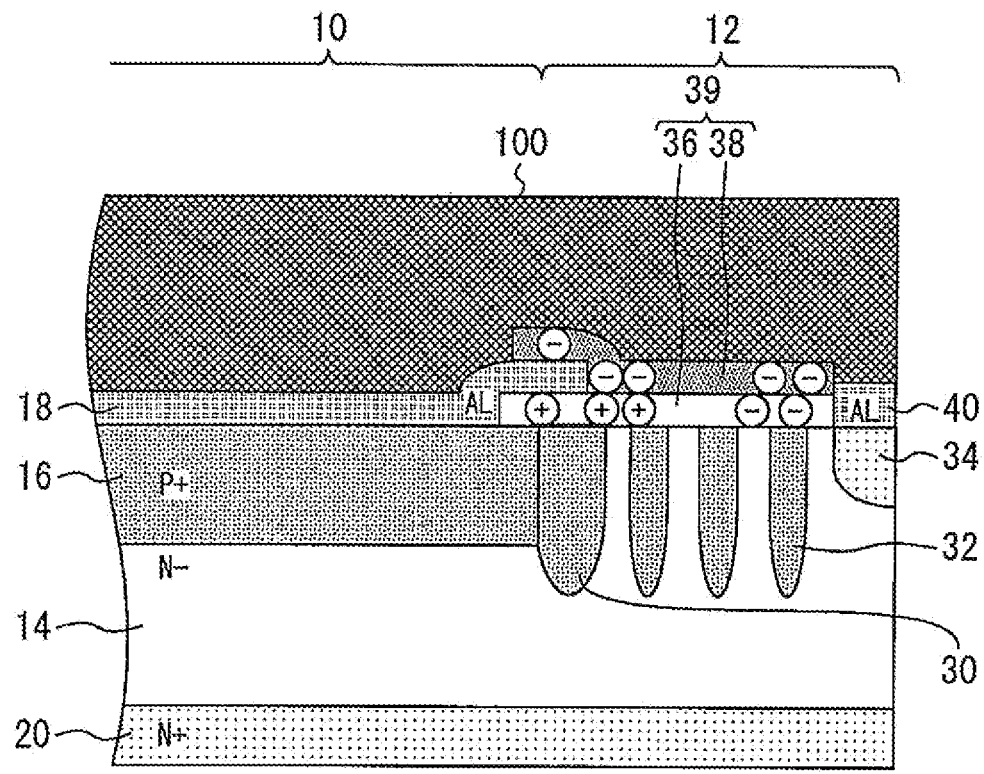
FIG. 9 is a cross-sectional view of a semiconductor device before it is tested.

FIG. 9 is a cross-sectional view of a semiconductor device before it is tested. This semiconductor device is similar to the semiconductor device described in connection with the first embodiment, except that it is sealed with a sealing material 100. The sealing material 100 is formed on the top surface layer 39. The sealing material 100 may be, but is not limited to, gel sealant.

This type of semiconductor device has a problem in that in some cases the upper semi-insulating film 38 of the top surface layer 39 is negatively polarized and the lower insulating film 36 of the top surface layer 39 is positively polarized, since the sealing material 100 covers the top surface layer 39. This polarization results in a decrease in the dielectric strength of the semiconductor device when it is subjected to a reliability test. Such polarization is often exhibited by semiconductor devices that have been produced using a new sealing material.

Figure 10:
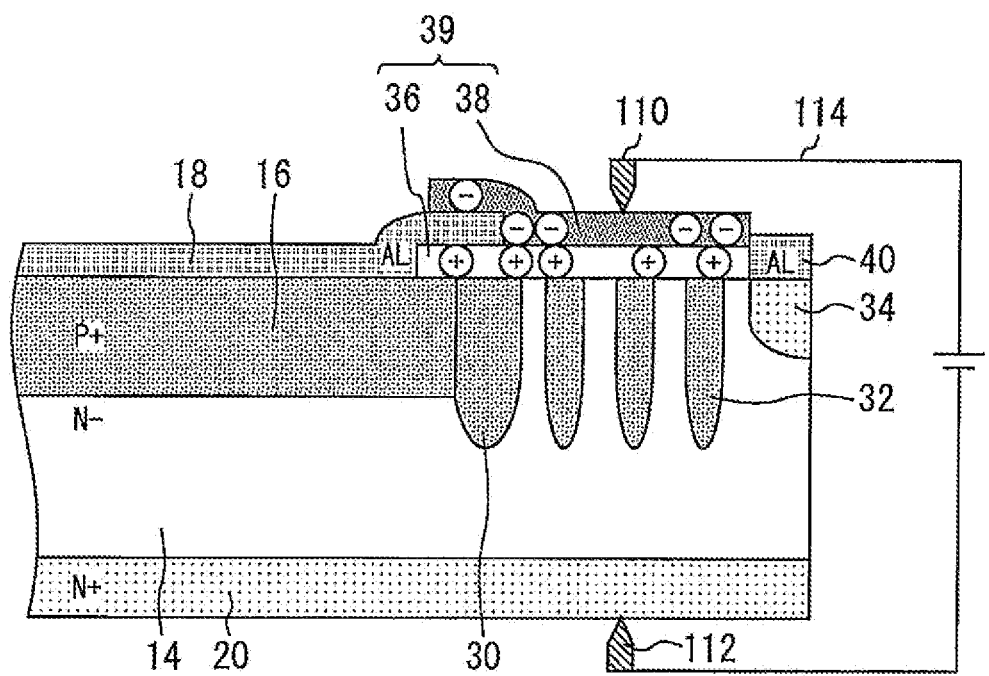
FIG. 10 is a cross-sectional view of the semiconductor device, illustrating the charge removal step.

The following describes a failure analysis method for the semiconductor device shown in FIG. 9 (assuming that the top surface layer 39 has been polarized). First, the sealing material 100 is removed to expose the top surface layer 39. This step is referred to herein as the sealing material removal step. After the sealing material removal step, charge is removed from the top surface layer 39. This step is referred to herein as the charge removal step. FIG. 10 is a cross-sectional view of the semiconductor device, illustrating the charge removal step. In the charge removal step, charge is removed from the top surface layer 39 using a voltage apply device 114 having a first conductor 110 at one end and a second conductor 112 at the other end.

Specifically, the first conductor 110 is brought into contact with the top surface layer 39 while the second conductor 112 is brought into contact with the bottom surface of the semiconductor device. A voltage is then applied between the first conductor 110 and the second conductor 112 so as to eliminate the charge on the top surface layer 39. That is, a higher potential is applied to the first conductor 110 than to the second conductor 112. In this way the top surface layer 39 can be depolarized, thereby eliminating polarization related problems.

Figure 11:
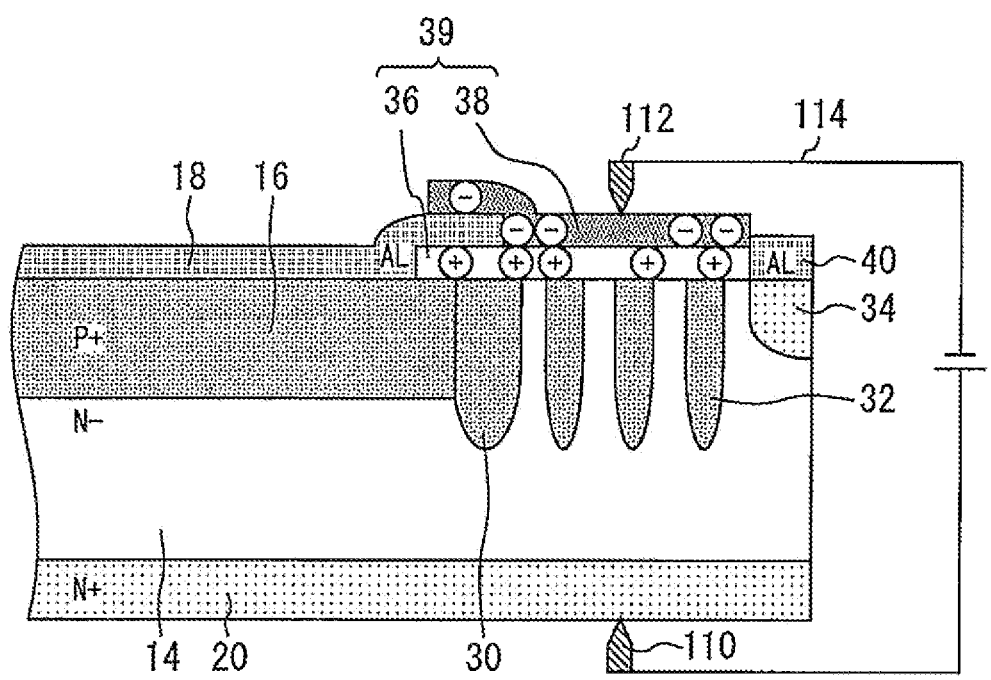
FIG. 11 is a cross-sectional view of the semiconductor device, illustrating a variation of the method of testing a semiconductor device.

FIG. 11 is a cross-sectional view of the semiconductor device, illustrating a variation of the method of testing a semiconductor device in accordance with the third embodiment. In this method, if the semi-insulating film 38 is negatively polarized and the insulating film 36 is positively polarized due to the presence of the sealing material, then the first conductor 110 is brought into contact with the bottom surface of the semiconductor device, the second conductor 112 is brought into contact with the top surface layer 39, and a higher potential is applied to the first conductor 110 than to the second conductor 112.

The present invention enables charge to be removed from the insulating film and/or semi-insulating film of the termination structure of a semiconductor device.

Obviously many modifications and variations of the present invention are possible in the light of the above teachings. It is therefore to be understood that within the scope of the appended claims the invention may be practiced otherwise than as specifically described.

What is claimed is:

1. A method of testing a semiconductor device having a substrate in and on which a cell structure and a termination structure are formed, said cell structure having a main current flowing therethrough, said termination structure surrounding said cell structure, said method comprising:
   a first test step of testing said semiconductor device, as a result of said first test step a top surface layer of said termination structure is polarized;
   a charge removal step of, after said first test step, removing a static charge from said top surface layer of said termination structure, said top surface layer being located on said substrate and formed of an insulating film and/or a semi-insulating film, wherein said charge removal step includes grounding said top surface layer by bringing a grounded device into contact with said top surface layer to thereby remove said static charge; and
   a second test step of, after said charge removal step, testing dielectric strength of said semiconductor device.

2. The method according to claim 1, wherein:
   said termination structure has a channel stopper on a side opposite from said cell structure, said channel stopper being formed in a top surface side of said substrate;
   said cell structure includes a top surface electrode formed in contact with said top surface layer;
   said termination structure includes a peripheral electrode formed in contact with said channel stopper and in contact with a side of said top surface layer and in contact with said channel stopper; and
   said charge removal step includes bringing a first conductor formed at one end of a resistor device into contact with said top surface electrode and a second conductor formed at the other end of said resistor device into contact with said peripheral electrode.

3. The method according to claim 1, wherein said termination structure includes an FLR structure, a RESURF structure, or a VLD structure formed in a top surface side of said substrate.

4. The method according to claim 1, wherein:
   said termination structure includes a plurality of FLRs formed in a top surface side of said substrate; and
   said top surface layer is formed on and in contact with said plurality of FLRs.

5. The method according to claim 1, wherein said semiconductor device is a diode, an IGBT, or a MOSFET.

6. The method according to claim 1, wherein said top surface layer of said termination structure is formed of both an insulating film and a semi-insulating film.

7. A method of testing a semiconductor device having a substrate in and on which a cell structure and a termination structure are formed, said cell structure having a main current flowing therethrough, said termination structure surrounding said cell structure and having on a top surface thereof a top surface layer formed of an insulating film and/or a semi-insulating film, said method comprising:

a charge removal step of removing a static charge from said top surface layer, wherein said charge removal step includes grounding said top surface layer by bringing a grounded device into contact with said top surface layer to thereby remove said static charge; and a test step of, after said charge removal step, testing dielectric strength of said semiconductor device.

8. The method according to claim 7, wherein said charge removal step includes bringing a conductor formed at one end of said grounding device into contact with said top surface layer, with the other end of said grounding device being grounded.

9. The method according to claim 8, wherein said conductor has a needle-like shape.

10. The method according to claim 8, wherein said conductor has a strip-like shape.

11. The method according to claim 8, wherein said conductor is a conductive ribbon.

12. The method according to claim 7, wherein said top surface layer of said termination structure is formed of both an insulating film and a semi-insulating film.

13. A method of testing a semiconductor device having a substrate in and on which a cell structure and a termination structure are formed, said cell structure having a main current flowing therethrough, said termination structure surrounding said cell structure and having on a top surface thereof a top surface layer which is formed of an insulating film and/or a semi-insulating film and which is covered with a sealing material, said method comprising:

a sealing material removal step of removing said sealing material to expose said top surface layer;

a charge removal step of, after said sealing material removal step, removing a static charge from said top surface layer, wherein said charge removal step includes grounding said to surface layer by bringing a grounded device into contact with said top surface layer to thereby remove said static charge; and a test step of, after said charge removal step, testing dielectric strength of said semiconductor device.

14. The method according to claim 13, wherein said charge removal step includes bringing a first conductor formed at one end of a voltage apply device into contact with said top surface layer and a second conductor formed at the other end of said voltage apply device into contact with a bottom surface of said semiconductor device, and applying a voltage between said first and second conductors so as to eliminate charge on said top surface layer.

* * * * *